United States Patent
Li et al.

(10) Patent No.: US 10,061,881 B2
(45) Date of Patent: Aug. 28, 2018

(54) CIRCUIT DESIGN SYSTEM AND CIRCUIT DESIGN METHOD

(71) Applicant: HITACHI, LTD., Chiyoda-ku, Tokyo (JP)

(72) Inventors: Wen Li, Tokyo (JP); Akio Yamamoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 14 days.

(21) Appl. No.: 15/454,171

(22) Filed: Mar. 9, 2017

(65) Prior Publication Data
US 2018/0004881 A1     Jan. 4, 2018

(30) Foreign Application Priority Data

Jun. 30, 2016 (JP) ................................ 2016-129620

(51) Int. Cl.
G06F 17/50     (2006.01)

(52) U.S. Cl.
CPC ...... *G06F 17/5045* (2013.01); *G06F 17/5036* (2013.01)

(58) Field of Classification Search
CPC .................................................. G06F 17/5045
USPC ........................................................ 716/102
See application file for complete search history.

(56) References Cited

U.S. PATENT DOCUMENTS

| | | | |
|---|---|---|---|
| 8,516,418 B2 * | 8/2013 | Singh ................. | G06F 17/5045 703/16 |
| 2002/0019730 A1 * | 2/2002 | Garner ................ | G06F 17/5045 703/14 |

FOREIGN PATENT DOCUMENTS

| | | |
|---|---|---|
| JP | 2003-6250 A | 1/2003 |
| JP | 2007-226824 A | 9/2007 |

\* cited by examiner

*Primary Examiner* — Suresh Memula
(74) *Attorney, Agent, or Firm* — Miles & Stockbridge P.C.

(57) ABSTRACT

A design efficiency is improved by enabling existing design resources to be utilized. A circuit design system includes a required specification input unit inputting required specification for designing a circuit, a computerized model conversion unit converting design information of an existing circuit into electronic data, a knowledge DB unit storing the design information of the existing circuit which is converted into the electronic data by the computerized model conversion unit, by converting the design information into a knowledge DB, a component DB unit storing information of a component which is used in a circuit, a circuit generation unit acquiring information which is obtained by converting the design information of the existing circuit into the knowledge DB and is stored in the knowledge DB unit, and the information of the component which is used in the circuit and is stored in the component DB unit, on the basis of the required specification which is input from the required specification input unit, and generating a circuit which satisfies the input required specification, and a generated circuit output unit transmitting information of the circuit satisfying the required specification, which is generated by the circuit generation unit, to the knowledge DB, and outputting the information of the circuit satisfying the required specification.

10 Claims, 10 Drawing Sheets

FIG. 8C

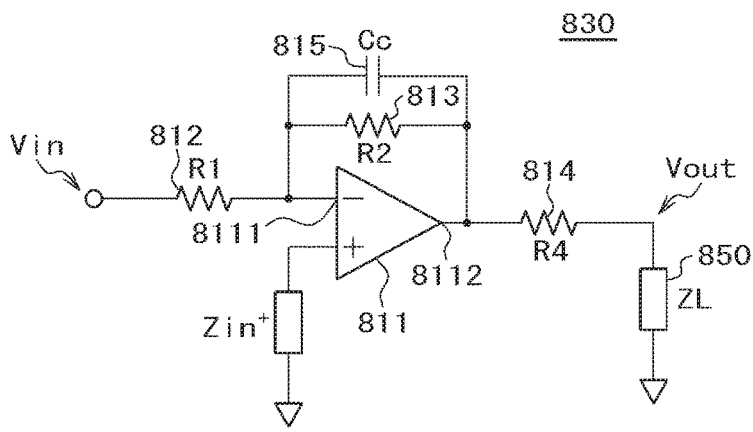

FIG. 9

| | ITEM | PERFORMANCE INFLUENCE | INFLUENCE RATE (%) | NOTE (OTHER COEFFICIENT CONDITIONS) |
|---|---|---|---|---|
| CIRCUIT ELEMENT MODULE 1: FEEDBACK CAPACITOR | BAND | ○ | 80 | FEEDBACK RESISTOR |
| | NOISE | × | 0 | ...... |
| | PHASE MARGIN | ○ | 100 | FEEDBACK RESISTOR INPUT, LOAD |
| | SIZE | △ | 10 | |
| | COST | × | | |
| | ... | ... | ... | |

| | ITEM | PERFORMANCE INFLUENCE | INFLUENCE RATE (%) | NOTE (OTHER COEFFICIENT CONDITIONS) |
|---|---|---|---|---|
| CIRCUIT ELEMENT MODULE 2: OUTPUT DUMPING RESISTOR | BAND | △ | 50 | LOAD IMPEDANCE |
| | NOISE | × | 0 | ...... |
| | PHASE MARGIN | ○ | 50 | LOAD IMPEDANCE |
| | SIZE | △ | 10 | |
| | COST | × | | |
| | ... | ... | ... | |

CIRCUIT DESIGN SYSTEM AND CIRCUIT DESIGN METHOD

TECHNICAL FIELD

The present invention relates to a circuit design system which designs a circuit with a high efficiency by using existing circuit resources, and a circuit design method using the circuit design system.

BACKGROUND ART

Recently, according to diversification and shortening of a product cycle due to a response to mass customization, a short TAT and a high efficiency of circuit design and verification are required. On the other hand, there is a case where it is not possible to respond to the needs described above due to a lack of a circuit designer, in particular, a skilled person. For this reason, a demand for an advanced circuit design support system or design automation increases.

Regarding this, in JP 2003-6250 A (Patent Document 1) relevant to a design support system, "At least a design specification design tool 140, a test specification design tool 150, a source code preparing tool 180 which functions as an editor of various program language files, and imports and exports data between the design specification design tool and the test specification design tool, a block diagram preparing tool 160 which converts the program language file and a block diagram into each other, and a waveform preparing tool 170 which converts the program language file and a waveform into each other are provided, a TreeView structure which is capable of layering and visually capturing design resources is adopted in each of the tools, and thus, a design procedure can be visually managed, and design data can be visually prepared/edited." is described in the section of Solution of Abstract.

In addition, in JP 2007-226824 A (Patent Document 2) relevant to a method for reusing design resources in integrated circuit design, "An instantiated component includes "deliverables" and "properties". The deliverable includes a file, a directory of the files, a group of the files, or a group of the directories, and the file, the directory of the files, the group of the files, or the group of the directories execute a common function and are characterized by a method which is standardized by a system. The properties include metadata describing a component version. A design file is abstracted into the deliverables, and thus, the system cooperates with a design file having various structures which can be obtained from all sources, and the design file can be used by the other designer in a uniform manner for efficiently reusing a component which is preliminary investigated. An operation in a design flow is tracked by the system. The system includes a communication application, an issue tracking application, and an audit trail application." is described in the section of Solution of Abstract.

CITATION LIST

Patent Document

Patent Document 1: JP 2003-6250 A
Patent Document 2: JP 2007-226824 A

SUMMARY OF THE INVENTION

Problems to be Solved by the Invention

Currently, a method of improving a design efficiency by utilizing past design resources with a knowledge and management system is disclosed. In order to share design know-how, the method sets a management rule of a circuit diagram or design specification including design knowledge, and provides a method, a tool, and a system that the designer easily accesses. Here, in general, the degree of understanding a design concept of an original designer or a basis for determining a circuit configuration and a parameter thereof is from the circuit diagram or the design specification is considerably different according to the ability or the level of the designer. In a case where the design concept or a basis of optimization is not capable of being sufficiently understood, the past design resources are not suitably reused, and thus, the design efficiency is not improved.

For example, FIG. 7A and FIG. 7B illustrate two configurations of simple amplification circuits using an operational amplifier. Main functions of these two circuits are the same inverting amplification circuit. Here, with respect to why a different circuit configuration is required in order to realize the same function or the similar function as in FIG. 7A and FIG. 7B or what function circuit elements Cc and R4 have, which further increase in FIG. 7B than in FIG. 7A, an expert for circuit design understands that Cc has a function of enhancing stability with respect to band limitation or capacitive input impedance of a circuit, and has a function of improving the stability of the circuit in a case where R4 is a capacitive output load, and thus, selects a circuit configuration according to a need for an actual application.

In contrast, in a case of a new designer for circuit design or a designer who is not an expert, the design concept described above or the function of the circuit element are not understood, and in a case where the function of Cc or R4 is not obviously described along with the circuit diagram, reusing the existing circuit configuration in new design is not simplified.

Here, in order to simply describe the problems, a simplified example is exemplified, but there is an enormous amount of design knowledge, which is more complicated than that in the simplified example, in actual circuit design.

Documenting design knowledge such as a large amount of design concepts or the basis of the optimization included in such an enormous amount of complicated design knowledge along with a design circuit diagram imposes a heavy burden on the designer, and thus, realizability is extremely low. Further, even in a case where a character type or an image file type circuit diagram is documented, it is difficult for the new designer to search resources which can be referred to the design of the new designer himself from a large amount of documents, and thus, it is difficult to improve the design efficiency.

Therefore, in order to improve the design efficiency by utilizing the existing design resources, it is important to decrease the burden on the designer in the extraction of design knowledge of an existing circuit and to visualize the design knowledge, and to efficiently change the circuit configuration and the parameter and to efficiently adjust the optimization with respect to new specification requirement.

Regarding this, in both of Patent Documents 1 and 2, it is not considered that the design knowledge is documented along with the design circuit diagram without imposing a heavy burden on the designer, and the existing resources which can be referred at the time of performing new design are efficiently searched.

The present invention solves the problems of the related art described above, and allows the existing circuit resources to be utilized with a high efficiency and an optimal circuit configuration plan to be automatically or semi-automatically generated with respect to given circuit specification, and thus, provides a circuit design system which realizes a short turn around time (TAT) and a high efficiency of design and verification, and a circuit design method.

Solutions to Problems

In order to solve the problems described above, in the present invention, a circuit design system, includes: a required specification input unit inputting required specification for designing a circuit; a computerized model conversion unit converting design information of an existing circuit into electronic data; a knowledge database unit storing the design information of the existing circuit which is converted into the electronic data by the computerized model conversion unit, by converting the design information into a knowledge database; a component database unit storing information of a component which is used in a circuit; a circuit generation unit acquiring information which is obtained by converting the design information of the existing circuit into the knowledge database and is stored in the knowledge database unit, and the information of the component which is used in the circuit and is stored in the component database unit, on the basis of the required specification which is input from the required specification input unit, and generating a circuit which satisfies the input required specification; and a generated circuit output unit transmitting information of the circuit satisfying the required specification, which is generated by the circuit generation unit, to the knowledge database, and outputting the information of the circuit satisfying the required specification.

In addition, in order to solve the problems described above, in a circuit design method using a circuit design system of the present invention, required specification for designing a circuit is input from a required specification input unit; design information of an existing circuit is converted into electronic data by a computerized model conversion unit; the design information of the existing circuit which is converted into the electronic data by the computerized model conversion unit, is converted into knowledge database and is stored in a knowledge database unit; information of a component which is used in the existing circuit, is stored in a component database unit; information which is obtained by converting the design information of the existing circuit into the knowledge database and is stored in the knowledge database unit, and the information of the component which is used in the circuit and is stored in the component database unit, are acquired on the basis of the required specification which is input from the required specification input unit, and a circuit which satisfies the input required specification is generated, by a circuit generation unit; and information of the circuit satisfying the required specification, which is generated by the circuit generation unit, is transmitted to the knowledge database, and the information of the circuit satisfying the required specification is output, from a generated circuit output unit.

Effects of the Invention

According to the present invention, existing circuit resources can be utilized with a high efficiency, and an optimal circuit configuration plan can be automatically or semi-automatically generated with respect to given circuit specification, and thus, it is possible to realize a short TAT and a high efficiency of design and verification.

In addition, according to the present invention, a knowledge DB is prepared from existing circuit design resources, the optimal circuit configuration plan is automatically or semi-automatically generated by using the knowledge DB, and thus, it is possible to generate the optimal circuit configuration plan regardless of a learning level of a designer.

BRIEF DESCRIPTION OF THE DRAWINGS

FIG. 8C is a configuration diagram of the inverting amplification circuit, which illustrates the circuit constituent module according to Example 1 of the present invention and a case where a resistor exists between the output terminal of the operational amplifier and the load and a capacitor exists between an inverting input terminal and the output terminal of the operational amplifier.

FIG. 9 is an image diagram illustrating performance influence list corresponding to the circuit constituent module according to Example 1 of the present invention.

MODE FOR CARRYING OUT THE INVENTION

Figure 1:
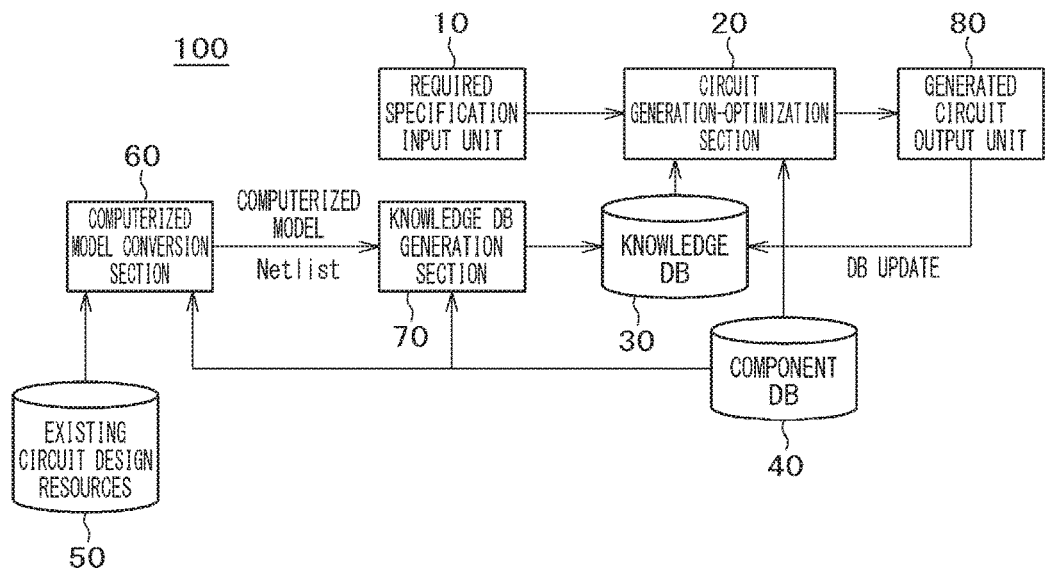
FIG. 1 is a block diagram illustrating a main configuration of a circuit design system according to Example 1 of the present invention.

The present invention relates to high-efficiency design of a circuit using circuit resources of the related art, and an automatic design method and an automatic design system of a circuit, and provides an electronic modeling method of paper type or image file type design resources of the related art, a method of automatically extracting a design concept and design knowledge or of constructing a knowledge database (hereinafter, referred to as a knowledge DB) with a high efficiency, and a method of automatically generating and optimizing a circuit configuration satisfying new design specification.

That is, the present invention provides high-efficiency design of a circuit including a section changing circuit design resources of the related art such as circuit diagram, for example, a character, an image, or the like, which is read only by a human being, and design specification to a form which can be automatically recognized and processed by a machine such as a PC or a calculator, a section automatically extracting a design concept and knowledge included in the circuit design resources and converting the design concept and the knowledge into a database, and a section automatically selecting and determining an optimal circuit configuration and an optimal parameter satisfying new design specification by using the knowledge DB and a general-purpose multivariable evaluation method, an automatic design method of a circuit, and a device thereof.

Specifically, first, the circuit design resources (the circuit diagram, the design specification, and the like) of the related art are scanned, and are converted into an electronic model such as a netlist which can be automatically processed by a machine such as a PC or a calculator, by using a section processing a document and recognizing an image pattern, and a symbol and component library.

Next, the design concept and the knowledge DB of the circuit are constructed by using the converted electronic model (the netlist). The knowledge DB basically includes two large databases. One database is an existing circuit design knowledge database (an existing circuit design knowledge DB) in which a main function and a representative performance corresponding to individual existing circuit design are grouped. The other database is a circuit element module knowledge database (a circuit element module knowledge DB) including a common circuit constituent module (a combination of C, R, L, and Tr) included in a large amount of existing circuit design, and a function of the element module.

Examples of a method of converting circuit element module knowledge into a database include two methods. One method is a method in which the contents described in a textbook or past design resources are manually converted into a database. The other method is an automatic extraction method.

A difference in similar circuit configurations and a difference in circuit functions and performances, which corresponds to the difference in the similar circuit configurations, are simultaneously extracted from the electronic model (the netlist) of a large amount of existing circuit design resources, and a correspondence relationship is established. The functions of the element module affecting the function and the performance of the circuit are arranged and are extracted as the circuit design concept and the knowledge from the correspondence relationship, and thus, the element module knowledge DB is constructed.

It is possible to construct high-efficiency design of a circuit or an automatic design system by using the constructed existing circuit design knowledge DB and the constructed element module knowledge DB. A circuit candidate plan close to the existing circuit design knowledge DB is selected, and a circuit constituent satisfying the circuit specification is added and corrected by the element module knowledge DB, with respect to required specification to be given. The performance of each of a plurality of circuit candidate plans which are generated, are evaluated by using a general-purpose multivariable evaluation function and an evaluation index, and the flow of selection, correction, evaluation, and recorrection is repeated such that a distance in a space of target specification converges on a target range, and thus, an optimal circuit configuration plan is generated and selected.

Hereinafter, embodiments of the present invention will be described in detail on the basis of the drawings. Furthermore, in all drawings for describing the embodiments, the same reference numerals will be basically applied to the same constituents, and the repeated description thereof will be omitted.

Example 1

A circuit design method of a first example of the present invention, which designs a circuit with a high efficiency by using existing circuit resources, and a device thereof will be described by using FIG. 1 to FIG. 9.

System Configuration

FIG. 1 is a block diagram illustrating the overall configuration of a circuit automatic design system 100 which designs a circuit with a high efficiency by using the existing circuit resources according to this example. The circuit automatic design system 100 according to this example has a function of automatically extracting a circuit design concept and design knowledge from existing circuit design resources, and a function of generating a design knowledge DB including a existing circuit design resource database (a circuit design resource DB) extracted from the existing circuit design resources and a circuit element module knowledge DB, and a circuit candidate plan satisfying required specification by using the design knowledge DB, and of correcting and optimizing performance evaluation and a circuit configuration.

This circuit automatic design system 100 includes a required specification input unit 10 performing interpretation processing with respect to the required specification, a knowledge DB 30 constructed from the existing circuit design resources, a component database (referred to as a component DB) 40 including a circuit component of each manufacturer which can be used in the circuit configuration, a circuit generation-optimization section 20 generating a circuit candidate plan corresponding to the required specification and optimizing a circuit configuration and a parameter by using the knowledge DB 30 and the component DB 40, and a generated circuit output unit 80 outputting the circuit which is generated and optimized by the circuit generation-optimization section 20 and constantly updating the knowledge DB 30.

This circuit automatic design system 100 further includes existing circuit design resources 50 including design paper such as a character or a document, a PDF, and a circuit diagram which is stored in other image formats, a computerized model conversion section 60 converting the existing circuit design resources 50 into a computerized model represented by a netlist which can be automatically recognized and processed by a machine such as a PC or a calculator, and a knowledge DB generation section 70 extracting already-computerized design knowledge including the existing circuit design knowledge DB which is changed by the computerized model conversion section 60 and is computerized and modelled, the element module knowledge DB, CAD data (not illustrated), or the like and generating a database.

Configuration of Existing Circuit Design Resource Computerization Model Section

Figure 2:
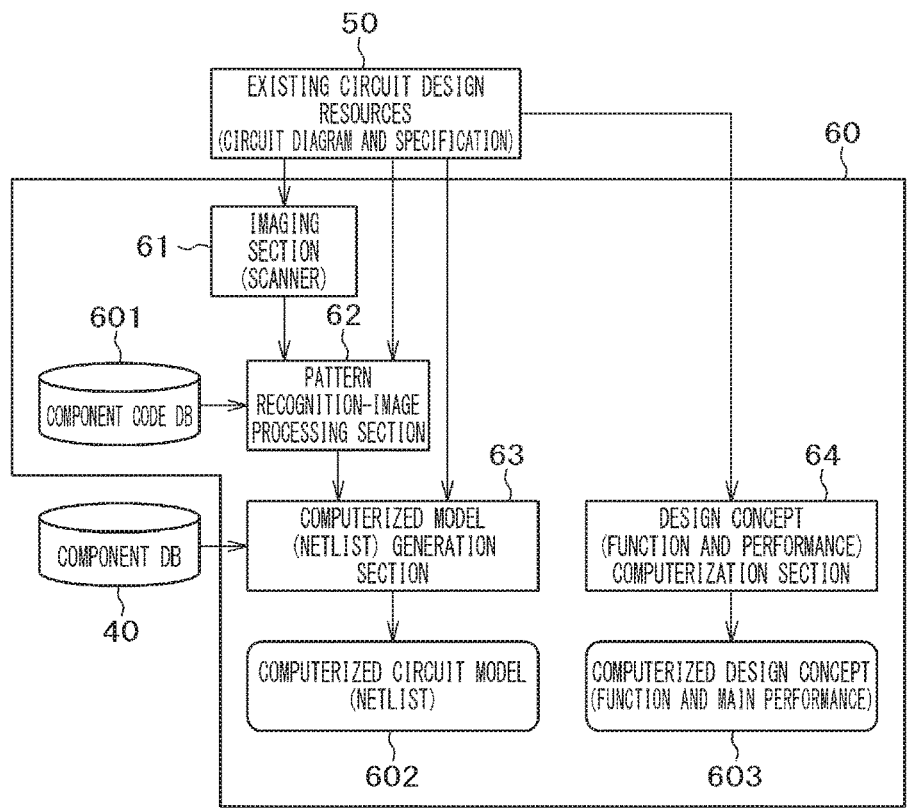
FIG. 2 is a block diagram illustrating a configuration of an electronic modeling section of existing circuit design resources of the circuit design system according to Example 1 of the present invention.

FIG. 2 illustrates the configuration of the computerized model conversion section 60 which computerizes the existing circuit design resources.

The computerized model conversion section 60 includes an imaging section 61, a pattern recognition-image processing section 62, a computerized model generation section 63, and a design concept computerization section 64.

In a case where the existing circuit design resources 50 are in the form of paper-based design paper or a circuit diagram, the circuit diagram is converted into a PDF or design resources in other image formats by using the imaging section 61 such as a scanner, and a component configuring a circuit and wiring connection are recognized by the pattern recognition-image processing section 62 which recognizes and images a pattern. A code describing method of the circuit component is usually different according to a designer, and thus, a component code database 601 registering a regular form of a code indicating the circuit component is also required for the computerized model generation section 63.

A computerized circuit model 602, which is represented by the netlist, is generated by using the component DB 40 describing the meaning of each pin which defines an interface between the circuit diagram and the component recognized by the pattern recognition-image processing section 62. Concurrently, a design concept such as a main function and a main performance of an existing circuit or other design concepts are extracted by the design concept computerization section 64 according to a method of text-recognizing and processing design paper such as design specification, and thus, a computerized design concept 603 is generated.

The generated computerized circuit model 602 and the generated computerized design concept 603 are input into the knowledge DB generation section 70.

Configuration of Knowledge DB Generation Section and Knowledge DB Configuration images of the knowledge DB generation section 70 and the knowledge DB 30 generating the knowledge DB 30 will be described by using FIG. 3 to FIG. 6.

Figure 3:
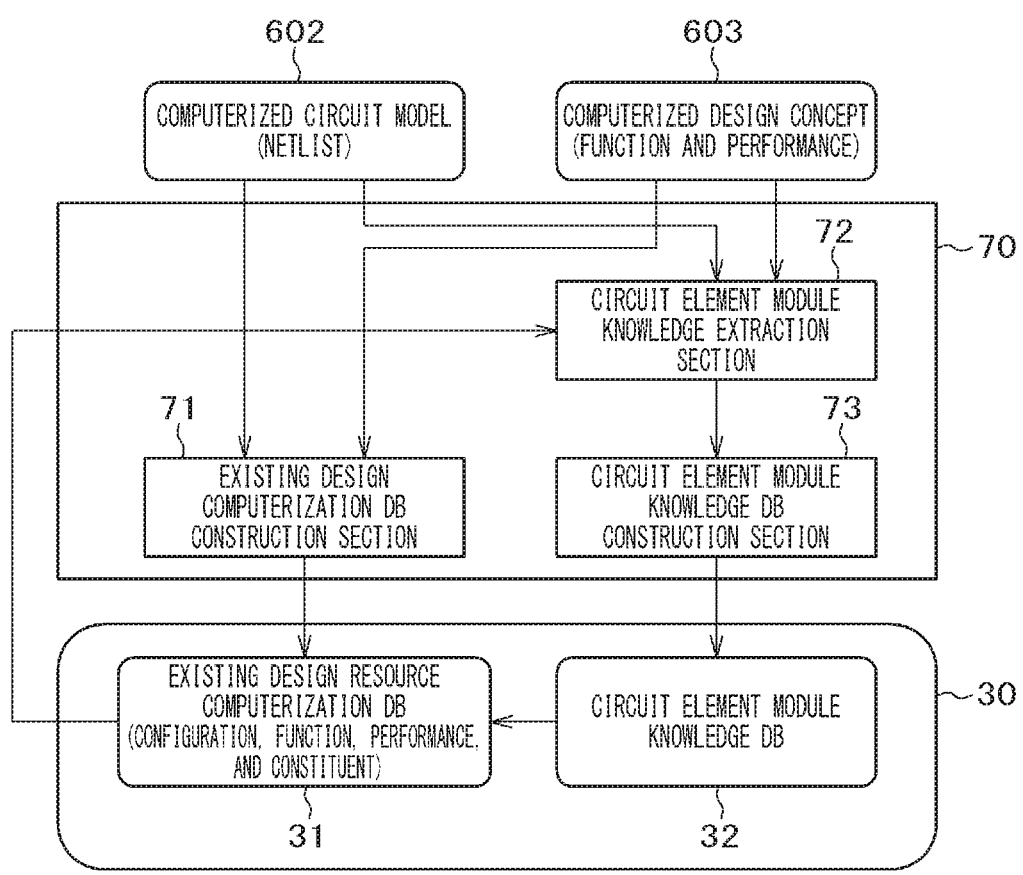
FIG. 3 is a block diagram illustrating a configuration of a design knowledge DB generation section according to Example 1 of the present invention.

FIG. 3 illustrates input data required for generating the knowledge DB 30, the configuration of the knowledge DB generation section 70, and output data.

The input data required for the knowledge DB generation section 70 is the computerized circuit model (the netlist or the like) 602 and the computerized design concept 603 of the existing circuit design resources 50 illustrated in FIG. 2. The output is an existing design resource computerization database (an existing design resource computerization DB) 31 and a circuit element module knowledge DB 32, and these two knowledge DBs configure the knowledge DB 30.

The knowledge DB generation section 70 includes the computerized circuit model 602 of the existing circuit, an existing design computerization database (an existing design computerization DB) construction section 71 grouping computerized function data and performance data of the corresponding computerized design concept 603, a circuit element module knowledge extraction section 72 extracting knowledge data of a circuit constituent from computerized data of the function and the performance of the computerized circuit model 602 and the computerized design concept 603, and a circuit element module knowledge DB construction section 73 constructing the knowledge data extracted by the circuit element module knowledge extraction section 72 in a database.

Figure 5:
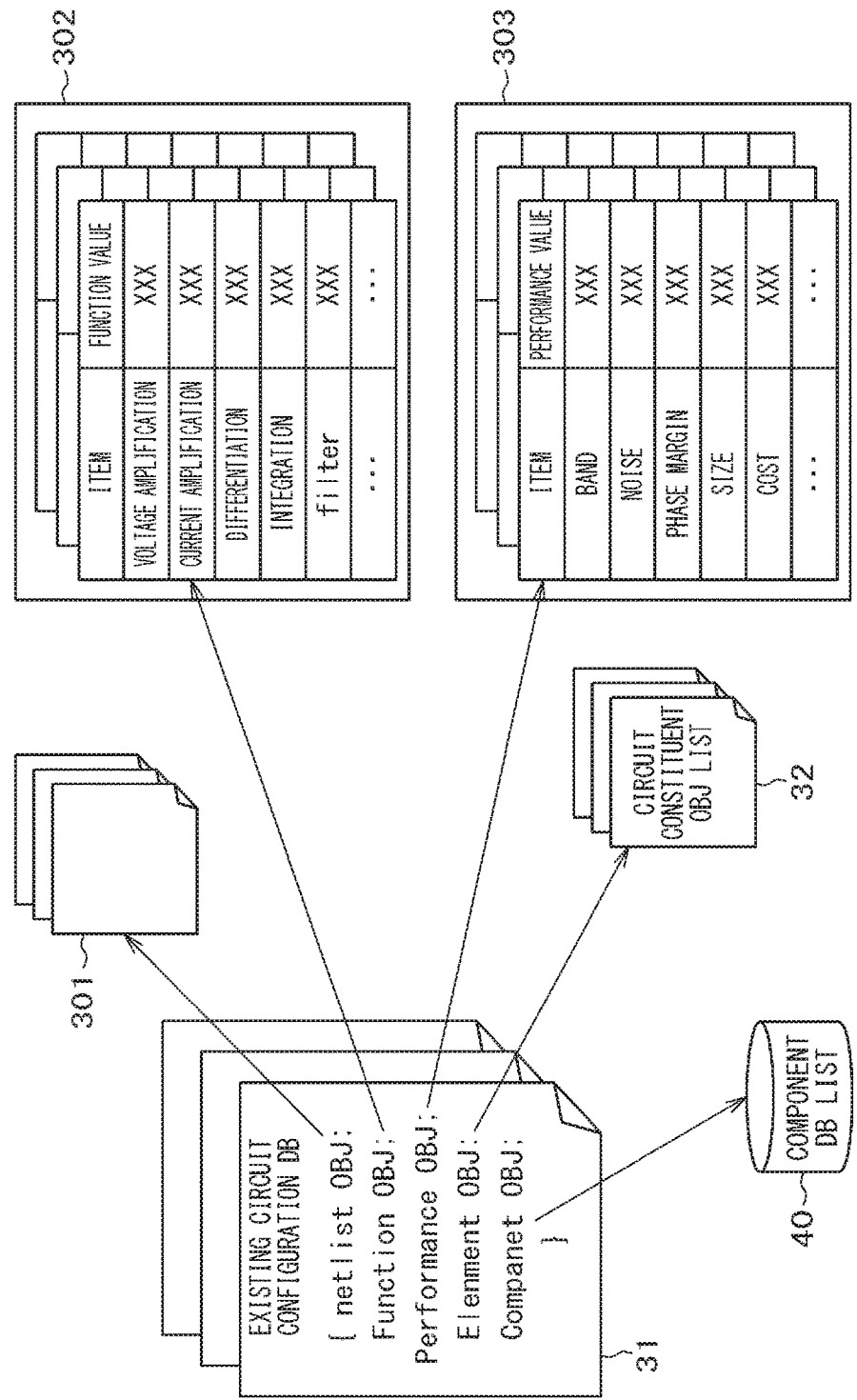
FIG. 5 is an image diagram illustrating construction of an existing circuit design resource computerization database according to Example 1 of the present invention.

A configuration image of the existing design resource computerization DB 31 is illustrated in FIG. 5.

Examples of a constituent of the existing design resource computerization DB 31 includes a netlist (a netlist OBJ) representing a detailed configuration of the circuit, a function element (Function OBJ) representing a main function of the circuit, a performance element (Performance OBJ) representing a main performance of the circuit, an element module (Element OBJ) included in the circuit, and a component element (Component OBJ) used in the circuit configuration.

These elements are linked with the elements of the netlist OBJ: 301, the circuit function DB: 302, the circuit performance DB: 303, the circuit element module DB: 32, and the component DB: 40, each of which is a database. One structure data item including the elements linked with each of the DBs represents one existing design matter. The assembly of these structures becomes the existing design resource computerization DB 31.

Figure 4:
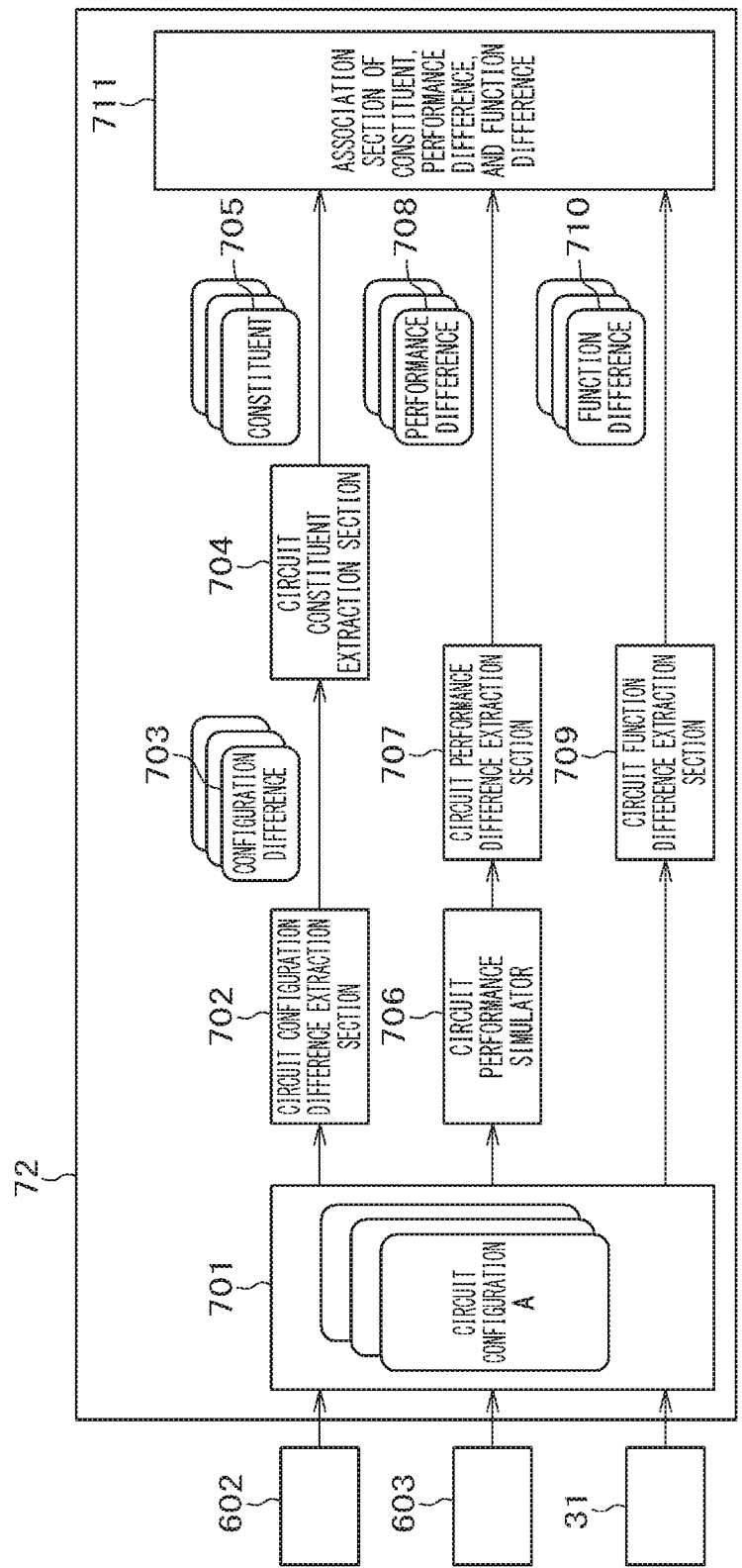
FIG. 4 is a block diagram illustrating configuration of a design knowledge extraction section relevant to a circuit constituent according to Example 1 of the present invention.

FIG. 4 illustrates a detailed configuration of the circuit element module knowledge extraction section 72.

The input of the circuit element module knowledge extraction section 72 is the computerized circuit model 602, the computerized design concept 603, and the generated existing design resource computerization DB 31. In a plurality of similar circuit configurations which are acquired from the input computerized circuit model 602, the input computerized design concept 603, and the input existing design resource computerization DB 31 by a plurality of circuit configuration generation sections 701, for example, a difference (a configuration difference 703) in a circuit configuration A, a circuit configuration B, and a circuit configuration C is extracted by a circuit configuration difference extraction section 702.

Next, the configuration difference 703 extracted by the circuit configuration difference extraction section 702 is input into a circuit constituent extraction section 704, and a constituent 705 is extracted from the configuration difference 703 by the circuit constituent extraction section 704.

Figure 8A:
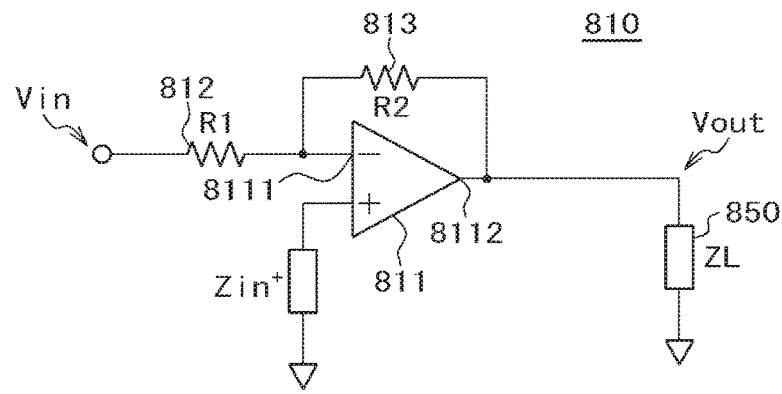
FIG. 8A is a configuration diagram of the inverting amplification circuit, which illustrates a circuit constituent module according to Example 1 of the present invention.
Figure 8B:
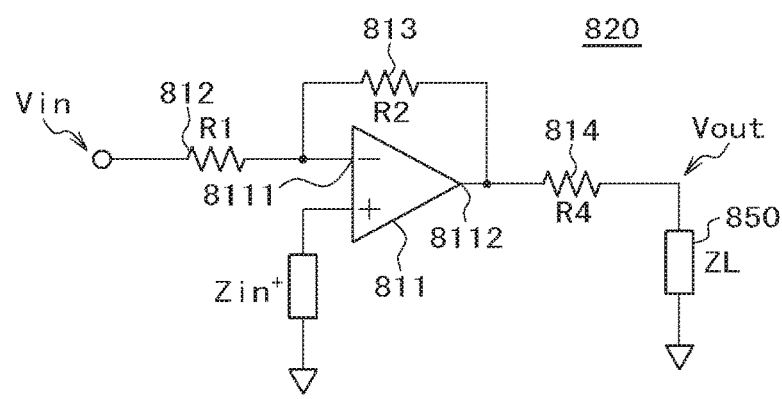
FIG. 8B is a configuration diagram of the inverting amplification circuit, which illustrates the circuit constituent module according to Example 1 of the present invention and a case where a resistor exists between the output terminal of the operational amplifier and the load.

For example, in a difference in constituents of three inverting amplification circuits 810, 820, and 830 illustrated in FIG. 8A to FIG. 8C, a difference between the circuit configuration A: 810 including an operational amplifier circuit 811 and resistors 812 and 813 and the circuit configuration B: 820 including the operational amplifier circuit 811 and resistors 812, 813, and 814 is the resistor R4: 814 of the circuit configuration B: 820. In addition, a difference between the circuit configuration B: 820 and the circuit configuration C: 830 is a capacitor Cc: 815 of the circuit configuration C: 830.

An element module referred to as an "output dumping resistor" in which the resistor R4: 814 exists between an output terminal 8112 of the operational amplifier circuit 811 and a load 820, is extracted as the constituent 705. In addition, An element module referred to as a "feedback capacitor" in which the capacitor Cc: 815 is connected between an inverting input terminal 8111 and the output terminal 8112 of the operational amplifier circuit 811 is extracted as the constituent 705.

Concurrently, the performances of the circuit configuration A: 810, the circuit configuration B: 820, and the circuit configuration C: 830 are evaluated by a circuit performance simulator 706, and the results of the performance evaluation are input into a circuit performance difference extraction section 707. A difference in the results of the performance evaluation input by the circuit performance difference extraction section 707 is extracted as a performance difference 708.

Similarly, in a case where a function difference exists in circuit configurations of each of the input computerized circuit model 602, the input computerized design concept 603, and the input existing design resource computerization DB 31, a function difference 710 is extracted by a circuit function difference extraction section 709.

Finally, the constituent 705, the performance difference 708, and the function difference 710, which are extracted, are associated (linked) with each other by an association section 711, and a knowledge DB relevant to a circuit element module configuring a circuit is constructed.

Figure 6:
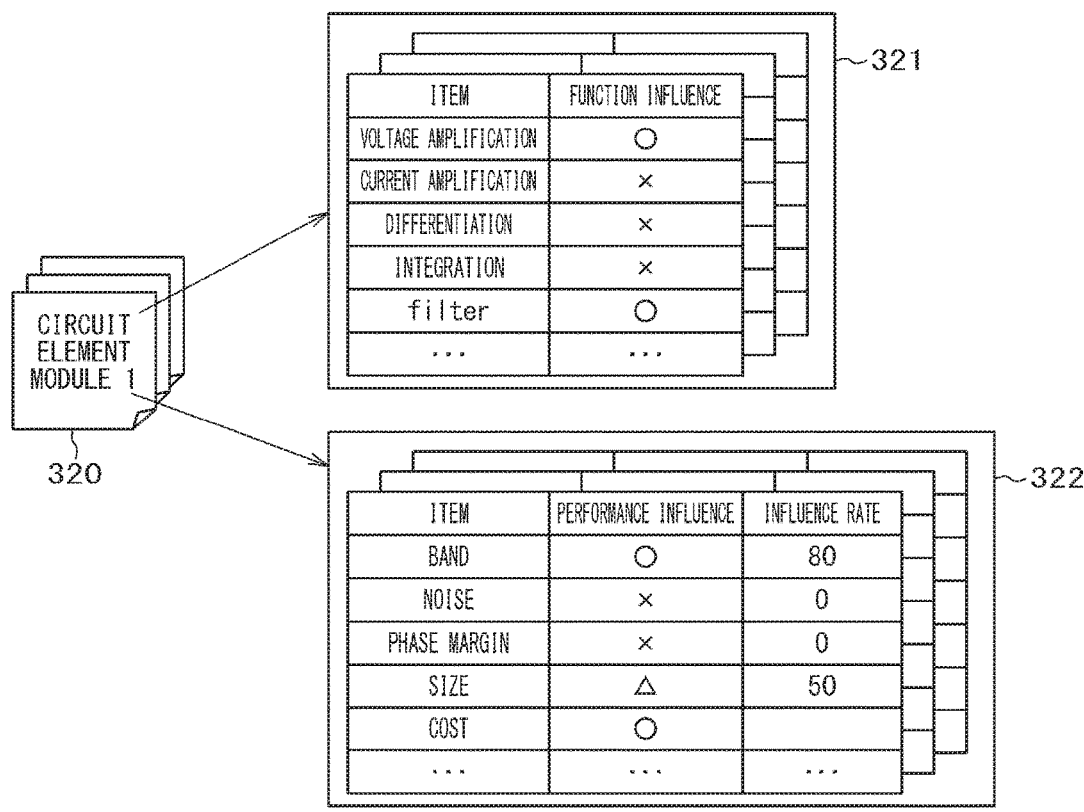
FIG. 6 is an image diagram illustrating construction of a design knowledge database relevant to the circuit constituent according to Example 1 of the present invention.
Figure 7A:
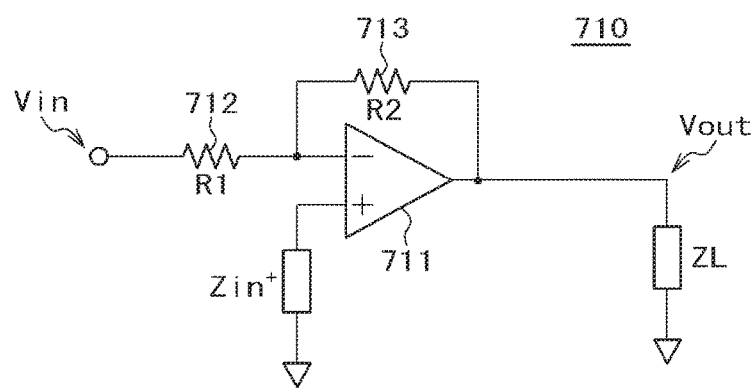
FIG. 7A is a configuration diagram of an inverting amplification circuit including design knowledge, which illustrates an object of the present invention.
Figure 7B:
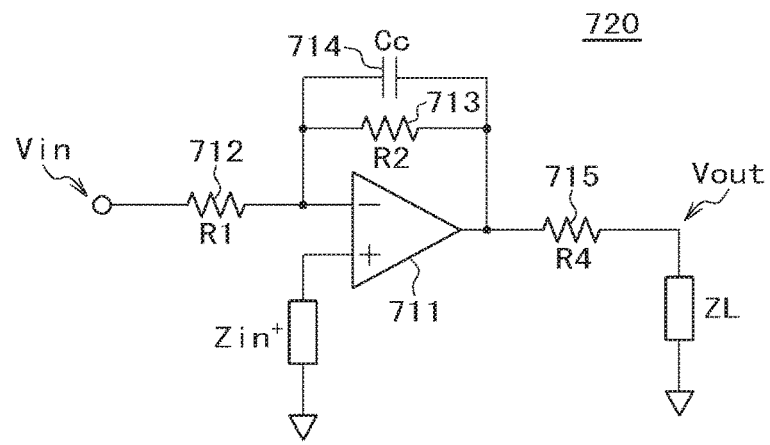
FIG. 7B is a configuration diagram of the inverting amplification circuit including the design knowledge, which illustrates an object of the present invention and a case where a resistor exists between an output terminal of an operational amplifier and a load.

An image of the circuit element module knowledge DB 32 which is the knowledge DB relevant to the constructed circuit element module, is illustrated in FIG. 6.

Examples of the circuit element module knowledge DB 32 includes an individual circuit element module list 320, a function influence list table 321 to which each circuit element module in the circuit element module list 320 corresponds, and a performance influence list table 322. The function influence list table 321 represents the presence or absence of the influence of each of the circuit element modules on a circuit function. Similarly, the performance influence list table 322 represents the presence or absence of the influence of each of the circuit element modules on a circuit performance.

The circuit configuration A: 810, the circuit configuration B: 820, and the circuit configuration C: 830 illustrated in FIG. 8A to FIG. 8C are simulated by the circuit performance simulator 706. The results thereof are processed by the circuit performance difference extraction section 707, and thus, It is possible to determine a difference in the circuit performances according to the presence or absence of the circuit element modules of the "feedback capacitor" and the "output dumping resistor" in the circuit configuration A: 810, the circuit configuration B: 820, or the circuit configuration C: 830.

Next, in the association section 711, a linkage with the circuit element module corresponding to a difference in the circuit performances determined by the circuit performance difference extraction section 707 is performed, and as illustrated in an example of FIG. 9, the functions of an element module 3301 are arranged such that a performance influence 332, an influence rate 333, and a note 334 in each of items 331 are shown in a table 330, and the functions of an element module 3302 are arranged such that a performance influence 342, an influence rate 343, and a note 344 in each of items 341 are shown in a table 340, and thus, it is possible to construct a knowledge DB relevant to an element module which can be visualized.

Configuration Image of Circuit Generation-Optimization Section

Finally, the configuration and a data processing flow of the circuit generation-optimization section 20 will be described by using FIG. 10 to FIG. 12.

Figure 10:
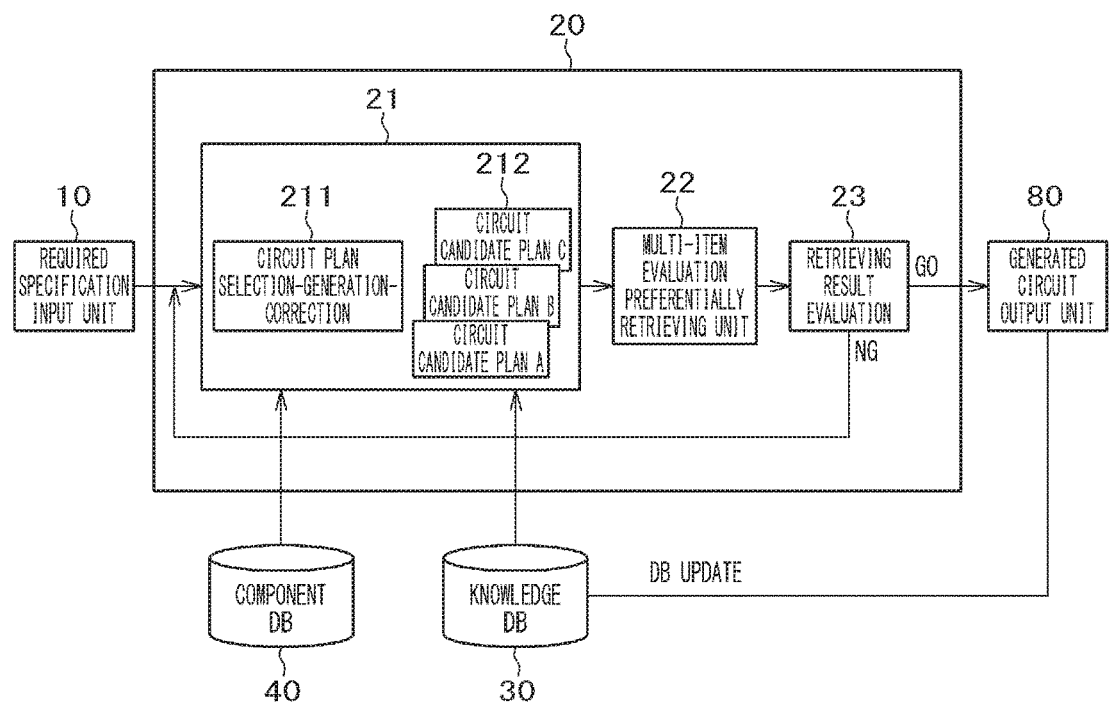
FIG. 10 is a block diagram illustrating an image of a circuit configuration plan automatic generation-optimization section according to Example 1 of the present invention.

As illustrated in a block diagram of FIG. 10, the circuit generation-optimization section 20 includes a circuit plan selection-generation-correction unit 21, a general-purpose evaluation preferentially retrieving unit 22, and a circuit plan optimization determination unit 23.

The circuit plan selection-generation-correction unit 21 selects a plurality of circuit configurations close to the required specification from the knowledge DB 30 according to the required specification input from the required specification input unit 10, performs circuit plan selection-generation-correction 211 which corrects the configuration or a circuit parameter of the element module according to new specification, with respect to the selected circuit configuration, and generates a plurality of circuit candidate plans 212.

Figure 11:
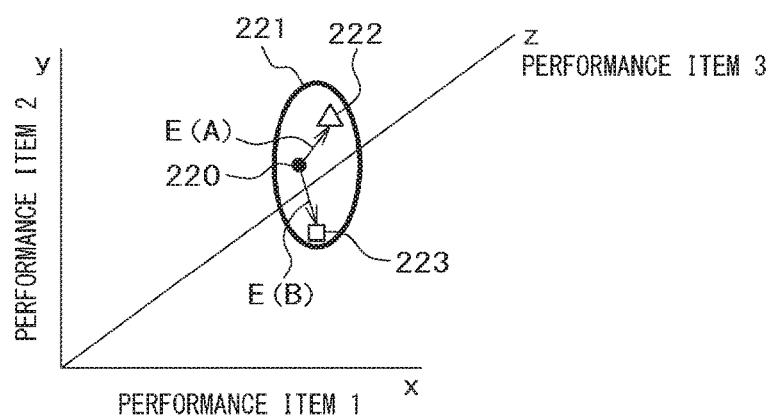
FIG. 11 is a diagram illustrating a general-purpose evaluation method and an evaluation function of a circuit generation-optimization section according to Example 1 of the present invention.
Figure 12:
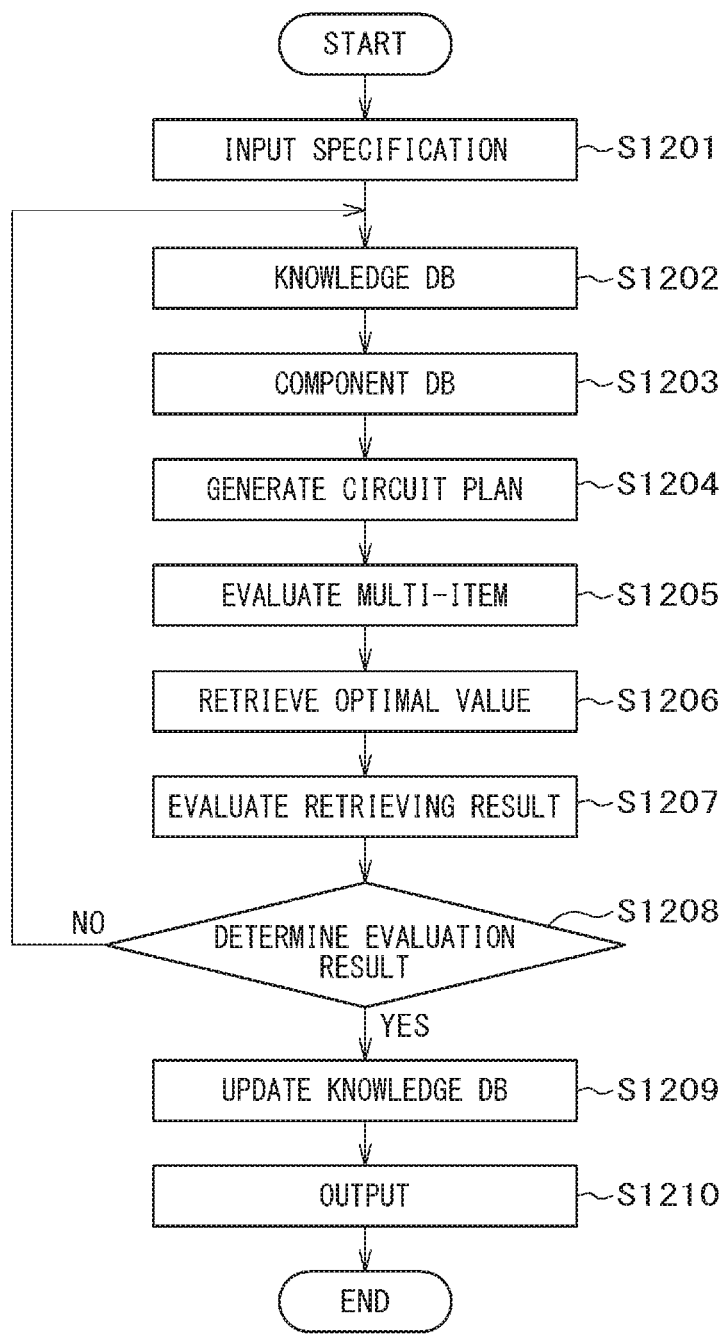
FIG. 12 is a flow diagram illustrating a procedure of a circuit design method using the circuit design system according to Example 1 of the present invention.

The general-purpose evaluation preferentially retrieving unit 22 evaluates the performance of the generated circuit candidate plan by a simulation, and performs evaluation by a general-purpose evaluation function as illustrated in FIG. 11.

The circuit plan optimization determination unit 23 determines whether or not an optimal value satisfying the required specification from the results of the evaluation of the general-purpose evaluation preferentially retrieving unit 22. In a case where the optimal value is not obtained, a plurality of new circuit candidate plans are generated by changing conditions in the circuit plan selection-generation-correction unit 21, and the processes in the general-purpose evaluation preferentially retrieving unit 22 and the circuit plan optimization determination unit 23 are repeated. In a case where the optimal value is obtained, the result is output to the generated circuit output unit 80.

Next, the processing flow of the circuit generation-optimization section 20 will be described on the basis of a flow diagram illustrated in FIG. 12.

First, the required specification for generating a circuit is input from the required specification input unit 10 (S1201). The circuit plan selection-generation-correction unit 21 of the circuit generation-optimization section 20 receives the input required specification, selects a plurality of circuit configurations close to the input required specification from the knowledge DB 30 (S1202), and selects the information of a component corresponding to the selected circuit configuration from the component DB 40 (S1203).

Next, in the circuit plan selection-generation-correction unit 21, generation or correction of a circuit plan from the configuration or the circuit parameter of the element module selected from the knowledge DB 30 according to the required specification input from the required specification input unit 10 repeatedly executed (211 in FIG. 10), and a plurality of circuit candidate plans (212 in FIG. 10) are generated (S1204).

Next, in the general-purpose evaluation preferentially retrieving unit 22, the performances of the plurality of circuit candidate plans generated by the circuit plan selection-generation-correction unit 21 are evaluated by a simulation, and evaluation is performed by a general-purpose evaluation function (S1205).

An evaluation method of the general-purpose evaluation function will be described by using FIG. 11.

First, a plurality of performances evaluation items are plotted in a space (in this example, a three-dimensional space), for example, such that a noise is plotted on a performance item 1: 224 (an X axis), a frequency bandwidth is plotted on a performance item 2: 225 (a Y axis), and power consumption is plotted on a performance item 3: 226 (a Z axis).

Next, on the basis of target values 220 ($X_o$, $Y_o$, and $Z_o$) of the evaluation index, the optimal value is retrieved by using a space range within a distance which is each of the evaluation items is allowed from the target value 220, as a target space 221 representing a target performance range (S1206).

In the optimization of the circuit configuration and the parameter, (a) A plan performances 222 ($X_a$, $Y_a$, and $Z_a$) and B plan performances 223 ($X_b$, $Y_b$, and $Z_b$), which are performance results of each of the circuit plans including all evaluation items required in the specification, fall within a target space, and (b) in a case where a plurality of values of the circuit configuration or the parameter within the target space exist, a value in which space vector distances E(A) and E(B) from the center target are minimized is set to the optimal value.

The vector distances E(A) and E(B) can be obtained by using (Expression 1) described below.

[Expression 1]

$$E(A)=kw \cdot |xo-xa|+k\phi \cdot |yo-ya|+kn \cdot |zo-za|$$

$$E(B)=kw \cdot |xo-xb|+k\phi \cdot |yo-yb|+kn \cdot |zo-zb| \quad \text{(Expression 1)}$$

kw, k$\phi$, and kn are performance coefficients (knowledge)
Select smaller one of E(A) and E(B)

Coefficients kw, k$\phi$, and kn are weight coefficients of each performance evaluation item in the general-purpose evaluation function, and are the contents of a part of the knowledge DB 30 according to the application of the circuit.

Next, the result of retrieving the optimal value is evaluated on the basis of the multi-item evaluation in S1205 (S1207), and as a result of determining the evaluation, in a case where (a) and (b) described above are not capable of being satisfied (in a case of NO in S1208), the process returns to S1202, the change and correction of the circuit parameter, the change of the component, or the correction of the circuit configuration are performed again by using the knowledge DB 30 and the component DB 40, and the generation and evaluation of the circuit plan is repeated until the value of a circuit plan which is capable of satisfying the conditions of (a) and (b) is obtained.

In a case where the value of the circuit plan which is capable of satisfying the conditions of (a) and (b) is obtained (in a case of YES in S1208), data is sent to the generated circuit output unit 80, and the generated circuit output unit 80 adds a set of a circuit plan and required specification which satisfy optimization conditions, to the knowledge DB 30, and updates and expands the knowledge DB 30 (S1209).

Finally, the generated circuit output unit 80 outputs a circuit configuration and a parameter which satisfy the optimization conditions (S1210), and thus, ends a set of operations.

As described above, according to this example, it is possible to utilize the existing circuit design resources with a high efficiency, to automatically or semi-automatically generate an optimal circuit configuration plan, and to realize a short TAT and a high efficiency of design and verification with respect to the given circuit specification.

In addition, according to this example, the knowledge DB is prepared from the existing circuit design resources, and the optimal circuit configuration plan is automatically or semi-automatically generated by using the knowledge DB, and thus, it is possible to generate optimal circuit configuration plan regardless of a learning level of a designer.

Example 2

Figure 13:
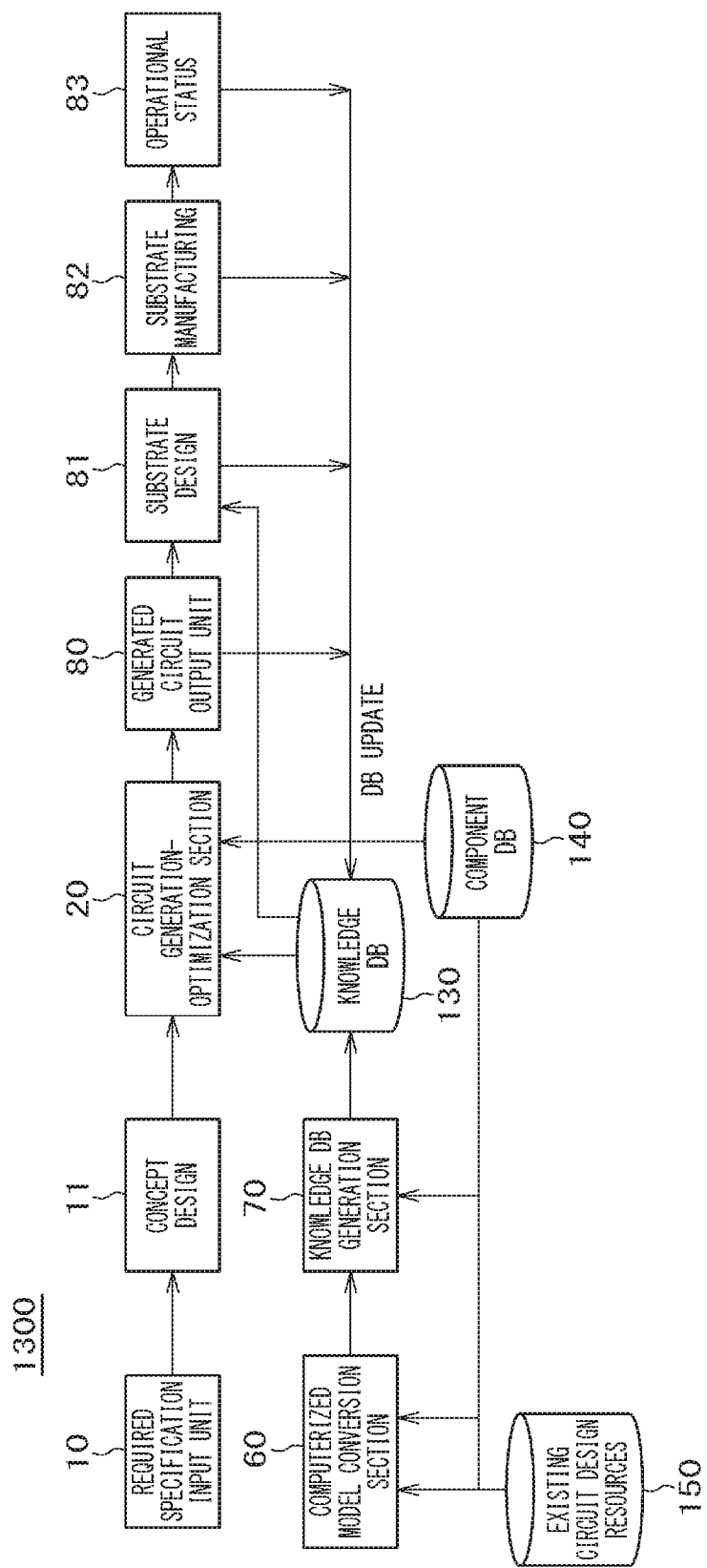
FIG. 13 is a block diagram illustrating a main configuration of a circuit design system according to Example 2 of the present invention.

A second example of the present invention will be described by using FIG. 13.

A circuit automatic design system 1300 of this example includes the circuit generation-optimization section 20 as with Example 1. As with Example 1, the circuit generation-optimization section 20 of this example has a function of automatically extracting a circuit design concept and design knowledge which are converted into computerized data from the existing circuit design resource 150 by the computerized model conversion section 60, are generated by the knowledge DB generation section 70, and are accumulated in a knowledge DB 130, and a function of generating a circuit candidate plan satisfy the required specification by using the optimizing knowledge DB 130, and of correcting and optimizing performance evaluation and a circuit configuration.

Here, the knowledge DB 130 of this example includes information 81 relevant to the design of a circuit substrate, information 82 relevant to the manufacturing of the circuit substrate, and information 83 relevant to an operational status of the manufactured circuit substrate. In a case where the circuit candidate plan satisfying the required specification is generated, and the performance evaluation and the circuit configuration are corrected and optimized, the circuit generation-optimization section 20 is capable of using a design concept and design knowledge relevant to the design and the manufacturing of the circuit substrate, which are accumulated in the knowledge DB 130.

Further, the circuit automatic design system 1300 in this example is configured as described above, and thus, it is possible to further use the information 81 relevant to the design of the circuit substrate, the information 82 relevant to the manufacturing of the circuit substrate, and the information 83 relevant to the operational status of the manufactured substrate circuit. Accordingly, it is possible to construct the knowledge DB 130 including substrate design knowledge such as a layer configuration, component arrangement, and optimal wiring of the circuit substrate, and to attain high efficiency and automation by using the knowledge DB 130, at the time of designing and manufacturing the circuit substrate by using the optimized circuit plan.

In addition, the information 82 relevant to the manufacturing of the circuit substrate can be optimized by converting component variation information and error and parasitic component information of manufacturing of a substrate at the time of manufacturing the circuit substrate into knowledge database, and by considering the information 82 relevant to the manufacturing of the circuit substrate at the time of generating the circuit plan and at the time of adjusting the parameter adjust. Further, the information 83 relevant to the operational status of the manufactured circuit substrate can be added and updated to the knowledge DB 130 by collecting situations and defects at the time of operating the circuit substrate by using a real-time information acquisition sensing section (not illustrated). Such information items are used at the time of performing the next circuit design and the next designing and manufacturing of a substrate, and thus, it is possible to improve the reliability of the entire circuit system.

As described above, the present invention made by the present inventors has been described in detail on the basis of the examples, but the present invention is not limited to the examples, and it is obvious that various changes can be performed within a range not departing from the gist of the present invention.

The invention claimed is:

1. A circuit design system, comprising:
a required specification input unit inputting required specification for designing a circuit;
a computerized model conversion unit converting design information of an existing circuit into electronic data;
a knowledge database unit storing the design information of the existing circuit which is converted into the electronic data by the computerized model conversion unit, by converting the design information into a knowledge database;

a component database unit storing information of a component which is used in a circuit;

a circuit generation unit acquiring information which is obtained by converting the design information of the existing circuit into the knowledge database and is stored in the knowledge database unit, and the information of the component which is used in the circuit and is stored in the component database unit, on the basis of the required specification which is input from the required specification input unit, and generating a circuit which satisfies the input required specification; and a generated circuit output unit transmitting information of the circuit satisfying the required specification, which is generated by the circuit generation unit, to the knowledge database, and outputting the information of the circuit satisfying the required specification.

2. The circuit design system according to claim 1, wherein the computerized model conversion unit includes an image processing unit converting the design information of the existing circuit into the electronic data, and recognizing a component in the design information of the circuit and wiring connection, a computerized model generation unit processing information of the component and the wiring connection, which are recognized by the image processing unit, and generating a computerized model such as a netlist, and a design concept computerization unit extracting a design concept including a main function and a main performance of the existing circuit from the design information of the existing circuit, and converting the design concept into electronic data.

3. The circuit design system according to claim 2, wherein the knowledge database unit includes a circuit element module knowledge data extraction unit extracting knowledge data of an element configuring a circuit from the computerized model which is generated by the computerized model generation unit of the computerized model conversion unit, and data of the function and data of the performance, included in the design concept which corresponds to the computerized model and is converted into the electronic data generated by the design concept computerization unit, and a circuit element module knowledge database construction unit constructing the knowledge data extracted by the circuit element module knowledge data extraction unit in a database.

4. The circuit design system according to claim 3, wherein the circuit element module knowledge data extraction unit includes a plurality of circuit configuration generation units generating a plurality of circuit configurations by using the computerized model which is generated by the computerized model generation unit and the design concept which is converted into the electronic data by the design concept computerization unit, a circuit configuration difference extraction unit extracting a difference in the plurality of circuit configurations which are generated by the plurality of circuit configuration generation units, a circuit constituent extraction unit extracting a circuit constituent from the difference in the circuit configurations, which is extracted by the circuit configuration difference extraction unit, a circuit performance simulator simulating a circuit performance with respect to the plurality of circuit configurations which are generated by the plurality of circuit configuration generation units, a circuit performance difference extraction unit extracting a difference in the circuit performances which are simulated by the circuit performance simulator, a circuit function difference extraction unit extracting a difference in circuit functions of the plurality of circuit configurations which are generated by the plurality of circuit configuration generation units, and a circuit constituent knowledge database construction section associating the circuit constituent which is extracted by the circuit constituent extraction unit, the difference in the circuit performances, which is extracted by the circuit performance difference extraction unit, and the difference in the circuit functions, which is extracted by the circuit function difference extraction unit with each other.

5. The circuit design system according to claim 1, wherein the circuit generation unit includes a plurality of circuit generation units acquiring information which is obtained by converting the design information of the existing circuit into the knowledge database and is stored in the knowledge database unit, and the information of the component which is used in the circuit and is stored in the component database unit, on the basis of the required specification which is input from the required specification input unit, and selecting a plurality of circuit candidates close to the input required specification, a circuit candidate retrieving unit evaluating a plurality of performances with respect to the plurality of circuit candidates which are generated by the plurality of circuit generation units, and retrieving a circuit candidate which is closest to a target performance, and a retrieving result evaluation unit evaluating a performance of the circuit candidate which is retrieved by the circuit candidate retrieving unit.

6. A circuit design method, comprising:

inputting required specification for designing a circuit from a required specification input unit;

converting design information of an existing circuit into electronic data by a computerized model conversion unit;

storing the design information of the existing circuit which is converted into the electronic data by the computerized model conversion unit, in a knowledge database unit, by converting the design information into knowledge database;

storing information of a component which is used in the existing circuit, in a component database unit;

acquiring information which is obtained by converting the design information of the existing circuit into the knowledge database and is stored in the knowledge database unit, and the information of the component which is used in the circuit and is stored in the component database unit, on the basis of the required specification which is input from the required specification input unit, and generating a circuit which satisfies the input required specification, by a circuit generation unit; and transmitting information of the circuit satisfying the required specification, which is generated by the circuit generation unit, to the knowledge database, and outputting the information of the circuit satisfying the required specification, from a generated circuit output unit.

7. The circuit design method according to claim 6,
wherein in converting the design information of the existing circuit into the electronic data by the computerized model conversion unit, the design information of the existing circuit is converted into the electronic data, and a component in the design information of the circuit and wiring connection are recognized, by an image processing unit, information of the component and the wiring connection, which are recognized by the image processing unit, is processed, and a computerized model such as a netlist is generated, by a computerized model generation unit, and a design concept including a main function and a main performance of the existing circuit is extracted from the design information of the existing circuit and is converted into electronic data, by a design concept computerization unit.

8. The circuit design method according to claim 7,
wherein in constructing a database by the knowledge database unit, knowledge data of an element configuring a circuit is extracted from the computerized model which is generated by the computerized model generation unit of the computerized model conversion unit, and data of the function and data of the performance, included in the design concept which corresponds to the computerized model and is converted into the electronic data generated by the design concept computerization unit, by a circuit element module knowledge data extraction unit, and the knowledge data which is extracted by the circuit element module knowledge data extraction unit, is constructed in a database by a circuit element module knowledge database construction unit.

9. The circuit design method according to claim 8,
wherein in extracting the knowledge data of the element configuring the circuit from the computerized model which is generated by the computerized model generation unit of the computerized model conversion unit, and the data of the function and the data of the performance, included in the design concept which corresponds to the computerized model and is converted into the electronic data generated by the design concept computerization unit, by the circuit element module knowledge data extraction unit, a plurality of circuit configurations are generated by using the computerized model which is generated by the computerized model generation unit and the design concept which is converted into the electronic data by the design concept computerization unit, by a plurality of circuit configuration generation units, a difference in the plurality of circuit configurations which are generated by the plurality of circuit configuration generation units, is extracted by a circuit configuration difference extraction unit, a circuit constituent is extracted from the difference in the circuit configurations, which is extracted by the circuit configuration difference extraction unit, by a circuit constituent extraction unit, a circuit performance is simulated with respect to the plurality of circuit configurations which are generated by the plurality of circuit configuration generation units, by a circuit performance simulator, a difference in the circuit performances which are simulated by the circuit performance simulator, is extracted by a circuit performance difference extraction unit, a difference in circuit functions of the plurality of circuit configurations which are generated by the plurality of circuit configuration generation units, is extracted by a circuit function difference extraction unit, and the circuit constituent which is extracted by the circuit constituent extraction unit, the difference in the circuit performance, which is extracted by the circuit performance difference extraction unit, and the difference in the circuit functions, which is extracted by the circuit function difference extraction unit, are associated with each other by a circuit constituent knowledge database construction section.

10. The circuit design method according to claim 6,
wherein information which is obtained by converting the design information of the existing circuit into the knowledge database and is stored in the knowledge database unit, and the information of the component which is used in the circuit and is stored in the component database unit, are acquired on the basis of the required specification which is input from the required specification input unit, and a plurality of circuit candidates close to the input required specification are selected, by a plurality of circuit generation units of the circuit generation unit, and a plurality of performances are evaluated with respect to the plurality of circuit candidates which are generated by the plurality of circuit generation units, and a circuit candidate which is closest to a target performance is retrieved, by a circuit candidate retrieving unit, and a performance of the circuit candidate which is retrieved by the circuit candidate retrieving unit, is evaluated by a retrieving result evaluation unit.

* * * * *